(12) United States Patent
Yamakado et al.

(10) Patent No.: US 12,734,561 B2
(45) Date of Patent: Sep. 15, 2026

(54) CLEANING METHOD, RECORDING MEDIUM, AND SUBSTRATE PROCESSING APPARATUS

(71) Applicant: Kokusai Electric Corporation, Tokyo (JP)

(72) Inventors: Yuki Yamakado, Toyama (JP); Katsunori Funaki, Toyama (JP); Tatsushi Ueda, Toyama (JP); Yasutoshi Tsubota, Toyama (JP); Yuichiro Takeshima, Toyama (JP); Keita Ichimura, Toyama (JP); Hiroto Igawa, Toyama (JP); Hiroki Kishimoto, Toyama (JP)

(73) Assignee: KOKUSAI ELECTRIC CORPORATION, Tokyo (JP)

( * ) Notice: Subject to any disclaimer, the term of this patent is extended or adjusted under 35 U.S.C. 154(b) by 719 days.

(21) Appl. No.: 18/076,552

(22) Filed: Dec. 7, 2022

(65) Prior Publication Data

US 2023/0201889 A1 Jun. 29, 2023

(30) Foreign Application Priority Data

Dec. 24, 2021 (JP) ................................ 2021-210465

(51) Int. Cl.
*B08B 7/00* (2006.01)
*B08B 9/08* (2006.01)
(Continued)

(52) U.S. Cl.
CPC .............. *B08B 7/0035* (2013.01); *B08B 9/08* (2013.01); *C23C 16/4405* (2013.01);
(Continued)

(58) Field of Classification Search
CPC ..... B08B 7/0035; B08B 9/08; B08B 2209/08; H01J 37/32449; H01J 2237/335; H01L 21/02236
See application file for complete search history.

(56) References Cited

U.S. PATENT DOCUMENTS 5,451,263 A * 9/1995 Linn ..................... H01L 23/544 257/E23.179
6,872,323 B1 * 3/2005 Entley ................ C23C 16/4405 134/1.1
(Continued)

FOREIGN PATENT DOCUMENTS

JP 2008-140864 A1 6/2008
JP 3161426 U 7/2010
(Continued)

OTHER PUBLICATIONS

Japanese Office Action issued on Jun. 6, 2023 for Japanese Patent Application No. 2021-210465.

*Primary Examiner* — Sharidan Carrillo
(74) *Attorney, Agent, or Firm* — Volpe Koenig

(57) ABSTRACT

There is provided a technique that includes modifying a deposited film, which is formed on an inner surface of a reaction container, into a film including an oxide layer and a nitride layer by performing a cycle a predetermined number of times, the cycle including: (a) oxidizing the deposited film by supplying an oxygen-containing gas into the reaction container and plasma-exciting the oxygen-containing gas; and (b) nitriding the deposited film by supplying a nitrogen-containing gas into the reaction container and plasma-exciting the nitrogen-containing gas.

18 Claims, 7 Drawing Sheets

(51) Int. Cl.

| | |
|---|---|
| ***C23C 16/44*** | (2006.01) |
| ***H01J 37/32*** | (2006.01) |
| ***H10P 14/60*** | (2026.01) |

(52) U.S. Cl.

CPC .... *H01J 37/32449* (2013.01); *H10P 14/6308* (2026.01); *B08B 2209/08* (2013.01); *H01J 2237/335* (2013.01)

(56) References Cited

U.S. PATENT DOCUMENTS

| | | | | |
|---|---|---|---|---|
| 2007/0181145 | A1* | 8/2007 | Ishizuka | B08B 7/0035 134/1.1 |
| 2008/0132083 | A1* | 6/2008 | Matsuura | C23C 16/45546 438/770 |
| 2010/0154707 | A1* | 6/2010 | Ishizuka | H01J 37/32862 118/696 |
| 2011/0201210 | A1* | 8/2011 | Sato | C23C 16/4554 438/770 |
| 2012/0263888 | A1* | 10/2012 | Matsuura | H01J 37/32862 427/255.394 |
| 2014/0106573 | A1 | 4/2014 | Terasaki et al. | |
| 2022/0081766 | A1* | 3/2022 | Hane | C23C 16/45551 |

FOREIGN PATENT DOCUMENTS

| | | | |
|---|---|---|---|
| JP | 2014-075579 | A | 4/2014 |
| JP | 2019-110274 | A | 7/2019 |

* cited by examiner

CLEANING METHOD, RECORDING MEDIUM, AND SUBSTRATE PROCESSING APPARATUS

CROSS-REFERENCE TO RELATED APPLICATION

This application is based upon and claims the benefit of priority from Japanese Patent Application No. 2021-210465, filed on Dec. 24, 2021, the entire contents of which are incorporated herein by reference.

TECHNICAL FIELD

The present disclosure relates to a cleaning method, a recording medium, and a substrate processing apparatus.

BACKGROUND

A substrate processing apparatus that processes a substrate by plasma-exciting a process gas by supplying high frequency power to a coil is known in the related art.

However, in the substrate processing apparatus as described above, a deposited film may be formed on the inner surface of a reaction container due to the plasma processing on the substrate, and may be peeled off from the substrate, which may cause particles.

SUMMARY

Some embodiments of the present disclosure provide a technique capable of easily removing a deposited film formed on the inner surface of a reaction container by plasma processing on a substrate.

According to one embodiment of the present disclosure, there is provided a technique that includes modifying a deposited film, which is formed on an inner surface of a reaction container, into a film including an oxide layer and a nitride layer by performing a cycle a predetermined number of times, the cycle including: (a) oxidizing the deposited film by supplying an oxygen-containing gas into the reaction container and plasma-exciting the oxygen-containing gas; and (b) nitriding the deposited film by supplying a nitrogen-containing gas into the reaction container and plasma-exciting the nitrogen-containing gas.

BRIEF DESCRIPTION OF DRAWINGS

The accompanying drawings, which are incorporated in and constitute a part of the specification, illustrate embodiments of the present disclosure.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

One Embodiment of the Present Disclosure

One embodiment of the present disclosure will be now described with reference to FIGS. 1 to 7C. The drawings used in the following description are all schematic, and the dimensional relationship, ratios, and the like of various elements shown in figures do not always match the actual ones. Further, the dimensional relationship, ratios, and the like of various elements between plural figures do not always match each other.

(1) CONFIGURATION OF SUBSTRATE PROCESSING APPARATUS

Figure 1:
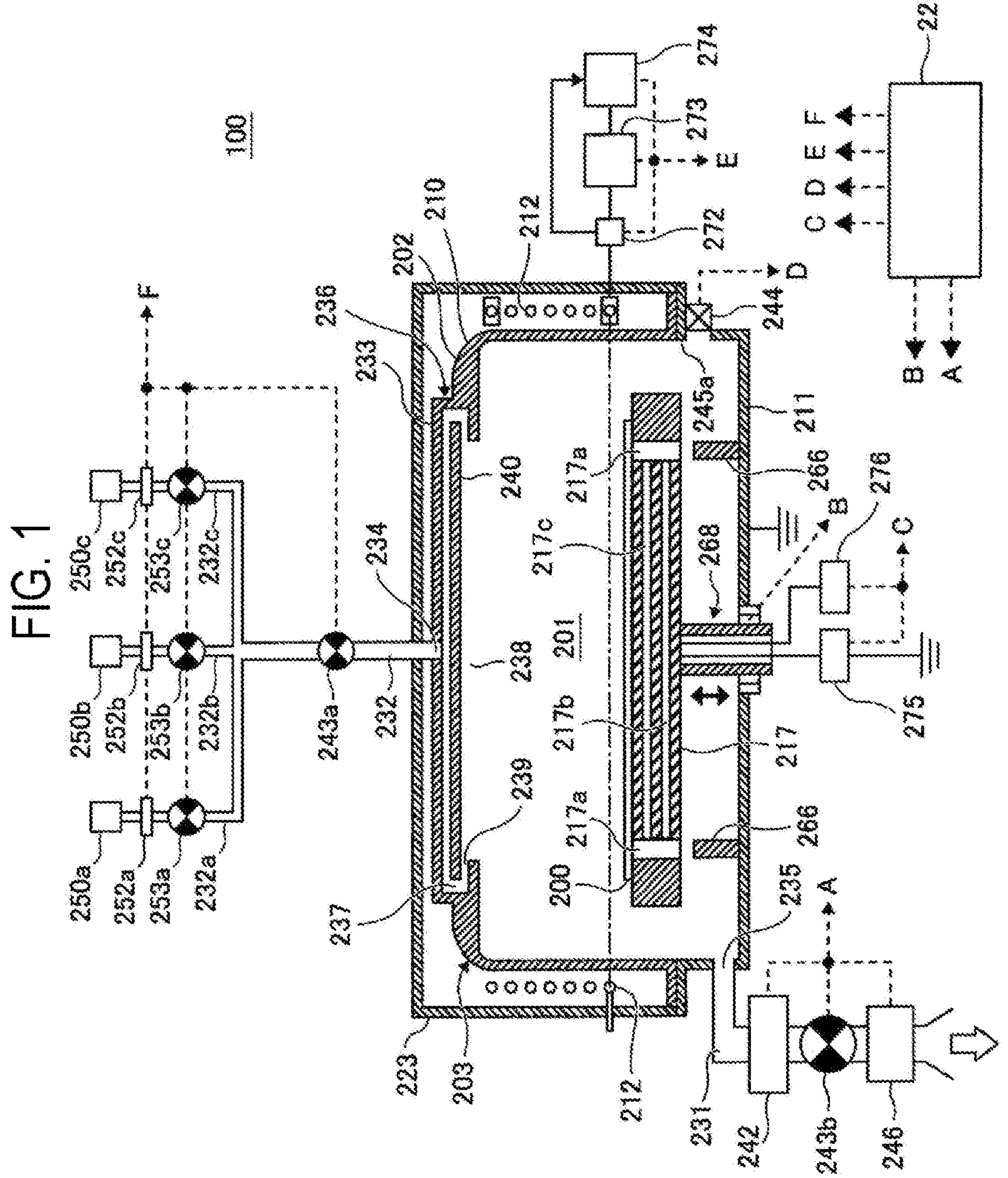
FIG. 1 is a schematic configuration view of a substrate processing apparatus suitably used in an embodiment of the present disclosure.

A substrate processing apparatus 100 according to one embodiment of the present disclosure will be described below with reference to FIG. 1. The substrate processing apparatus according to the one embodiment of the present disclosure is configured to mainly perform an oxidation process on a film or base formed on a substrate surface.

(Process Chamber)

The substrate processing apparatus 100 includes a process furnace 202 as a reaction container that plasma-processes a wafer 200 as a substrate. A process container 203 that constitutes a process chamber 201 is installed in the process furnace 202. The process container 203 includes a dome-shaped upper container 210, which is a first container, and a bowl-shaped lower container 211, which is a second container. The process chamber 201 is formed by covering the upper container 210 on the lower container 211. The upper container 210 is made of quartz. The upper container 210 constitutes a plasma container forming a plasma generation space in which a process gas is plasma-excited.

A gate valve 244 is installed on a lower sidewall of the lower container 211.

The process chamber 201 includes a plasma generation space where a resonance coil 212, which is a coil as an electrode, is installed and a substrate processing space communicating with the plasma generation space, in which the wafer 200 is processed. The plasma generation space is a space in which plasma is generated, and refers to a space in the process chamber 201 above the lower end of the resonance coil 212 and below the upper end of the resonance coil 212. On the other hand, the substrate processing space is a space in which the substrate is processed by using plasma, and refers to a space below the lower end of the resonance coil 212. In one embodiment of the present disclosure, the diameters of the plasma generation space and the substrate processing space in the horizontal direction are substantially the same.

(Susceptor)

A susceptor 217 as a substrate mounting table on which the wafer 200 is mounted is disposed at the center of the bottom side of the process chamber 201. The susceptor 217 is installed below the resonance coil 212 in the process chamber 201.

A heater 217*b* as a heating mechanism is integrally buried inside the susceptor 217.

The susceptor 217 is electrically insulated from the lower container 211. In order to further improve the uniformity of the density of plasma generated on the wafer 200 mounted on the susceptor 217, an impedance adjustment electrode 217*c* is installed inside the susceptor 217 and is grounded via an impedance variable mechanism 275 as an impedance adjuster (impedance adjuster).

The susceptor 217 is installed with a susceptor elevator 268 including a drive mechanism for raising or lowering the susceptor 217. Further, the susceptor 217 is provided with through-holes 217*a*, and wafer push-up pins 266 are installed on the bottom surface of the lower container 211. When the susceptor 217 is lowered by the susceptor elevator 268, the wafer push-up pins 266 are configured to penetrate through the through-holes 217*a* in a state where the wafer push-up pins 266 is in non-contact with the susceptor 217.

(Gas Supplier)

A gas supply head 236 is installed above the process chamber 201, that is, in the upper portion of the upper container 210. The gas supply head 236 includes a cap-shaped lid 233, a gas introduction port 234, a buffer chamber 237, an opening 238, a shielding plate 240, and a gas ejection port 239 and is configured to be able to supply a reaction gas into the process chamber 201.

The downstream end of an oxygen-containing gas supply pipe 232*a* for supplying an oxygen-containing gas, the downstream end of a hydrogen-containing gas supply pipe 232*b* for supplying a hydrogen-containing gas, and a nitrogen gas supply pipe 232*c* for supplying a nitrogen gas are connected to the gas introduction port 234 so as to merge with each other. The oxygen-containing gas supply pipe 232*a* is installed with an oxygen-containing gas supply source 250*a*, a mass flow controller (MFC) 252*a* as a flow control device, and a valve 253*a* as an opening/closing valve, sequentially from the upstream side. The hydrogen-containing gas supply pipe 232*b* is installed with a hydrogen-containing gas supply source 250*b*, a MFC 252*b*, and a valve 253*b*, sequentially from the upstream side. The nitrogen gas supply pipe 232*c* is installed with a nitrogen gas supply source 250*c*, a MFC 252*c*, and a valve 253*c*, sequentially from the upstream side. A valve 243*a* is installed on the downstream side where the oxygen-containing gas supply pipe 232*a*, the hydrogen-containing gas supply pipe 232*b*, and the nitrogen gas supply pipe 232*c* merge with each other, and is connected to the upstream end of the gas introduction port 234.

A gas supplier (gas supply system) according to the one embodiment of the present disclosure mainly includes the gas supply head 236, the oxygen-containing gas supply pipe 232*a*, the hydrogen-containing gas supply pipe 232*b*, the nitrogen-containing gas supply pipe 232*c*, the MFCs 252*a*, 252*b*, and 252*c*, and the valves 253*a*, 253*b*, 253*c*, and 243*a*. The gas supplier (gas supply system) is configured to supply a process gas into the process container 203.

Further, an oxygen-containing gas supply system according to the one embodiment of the present disclosure includes the gas supply head 236, the oxygen-containing gas supply pipe 232*a*, the MFC 252*a*, and the valves 253*a* and 243*a*. Further, a hydrogen-containing gas supply system according to the one embodiment of the present disclosure includes the gas supply head 236, the hydrogen-containing gas supply pipe 232*b*, the MFC 252*b*, and the valves 253*b* and 243*a*. Further, a nitrogen-containing gas supply system according to the one embodiment of the present disclosure includes the gas supply head 236, the nitrogen-containing gas supply pipe 232*c*, the MFC 252*c*, and the valves 253*c* and 243*a*.

(Exhauster)

A gas exhaust port 235 for exhausting a reaction gas from the process chamber 201 is installed on the sidewall of the lower container 211. The upstream end of a gas exhaust pipe 231 is connected to the gas exhaust port 235. The gas exhaust pipe 231 is installed with an auto pressure controller (APC) valve 242 as a pressure regulator (a pressure adjuster), a valve 243*b* as an opening/closing valve, and a vacuum pump 246 as a vacuum exhaust device, sequentially from the upstream side. An exhauster according to the one embodiment of the present disclosure mainly includes the gas exhaust port 235, the gas exhaust pipe 231, the APC valve 242, and the valve 243*b*.

(Plasma Generator)

The resonance coil 212 is installed on an outer periphery of the process chamber 201, that is, on the outside of the sidewall of the upper container 210 so as to spirally wind a plurality of times along the outer periphery of the upper container 210. A RF sensor 272, a high frequency power supply 273, and a matching device 274 that matches the impedance and output frequency of the high frequency power supply 273, are connected to the resonance coil 212.

The high frequency power supply 273 supplies high frequency power (RF power) to the resonance coil 212. The RF sensor 272 is installed on the output side of the high frequency power supply 273 and monitors information of a traveling wave and a reflected wave of the supplied high frequency power. The reflected wave power monitored by the RF sensor 272 is input to the matching device 274, and the matching device 274 controls the impedance of the high frequency power supply 273 and the frequency of the output high frequency power so as to minimize the reflected wave, based on the information of the reflected wave input from the RF sensor 272.

The high frequency power supply 273 includes a power supply controller (control circuit) including a high frequency oscillation circuit and a preamplifier for defining an oscillation frequency and an output, and an amplifier (output circuit) for amplifying the output of the control circuit to a predetermined output. The power supply controller controls the amplifier based on a preset frequency and power output conditions through an operation panel. The amplifier supplies constant high frequency power to the resonance coil 212 via a transmission line.

The winding diameter, winding pitch, and number of turns of the resonance coil 212 are set so that the resonance coil 212 resonates at a constant wavelength in order to form a standing wave having a predetermined wavelength. That is, the electrical length of the resonance coil 212 is set to a length corresponding to an integral multiple (1 times, 2 times, . . . ) of one wavelength at a predetermined frequency of the high frequency power supplied from the high frequency power supply 273.

A shielding plate 223 is provided to shield an electric field outside the resonance coil 212 and to form a capacitance component (C component), which is necessary for forming a resonance circuit, between the shielding plate 223 and the resonance coil 212.

A plasma generator according to the one embodiment of the present disclosure mainly includes the resonance coil 212, the RF sensor 272, and the matching device 274. The high frequency power supply 273 may be included as the plasma generator.

(Controller)

A controller 221 as a controller is configured to be capable of controlling the APC valve 242, the valve 243*b*, and the vacuum pump 246 through a signal line A, the susceptor elevator 268 through a signal line B, a heater power adjuster 276 and the impedance variable mechanism 275 through a signal line C, the gate valve 244 through a signal line D, the RF sensor 272, the high frequency power supply 273, and the matching device 274 through a signal line E, and the MFCs 252*a* to 252*c* and the valves 253*a* to 253*c* and 243*a* through a signal line F.

Figure 2:
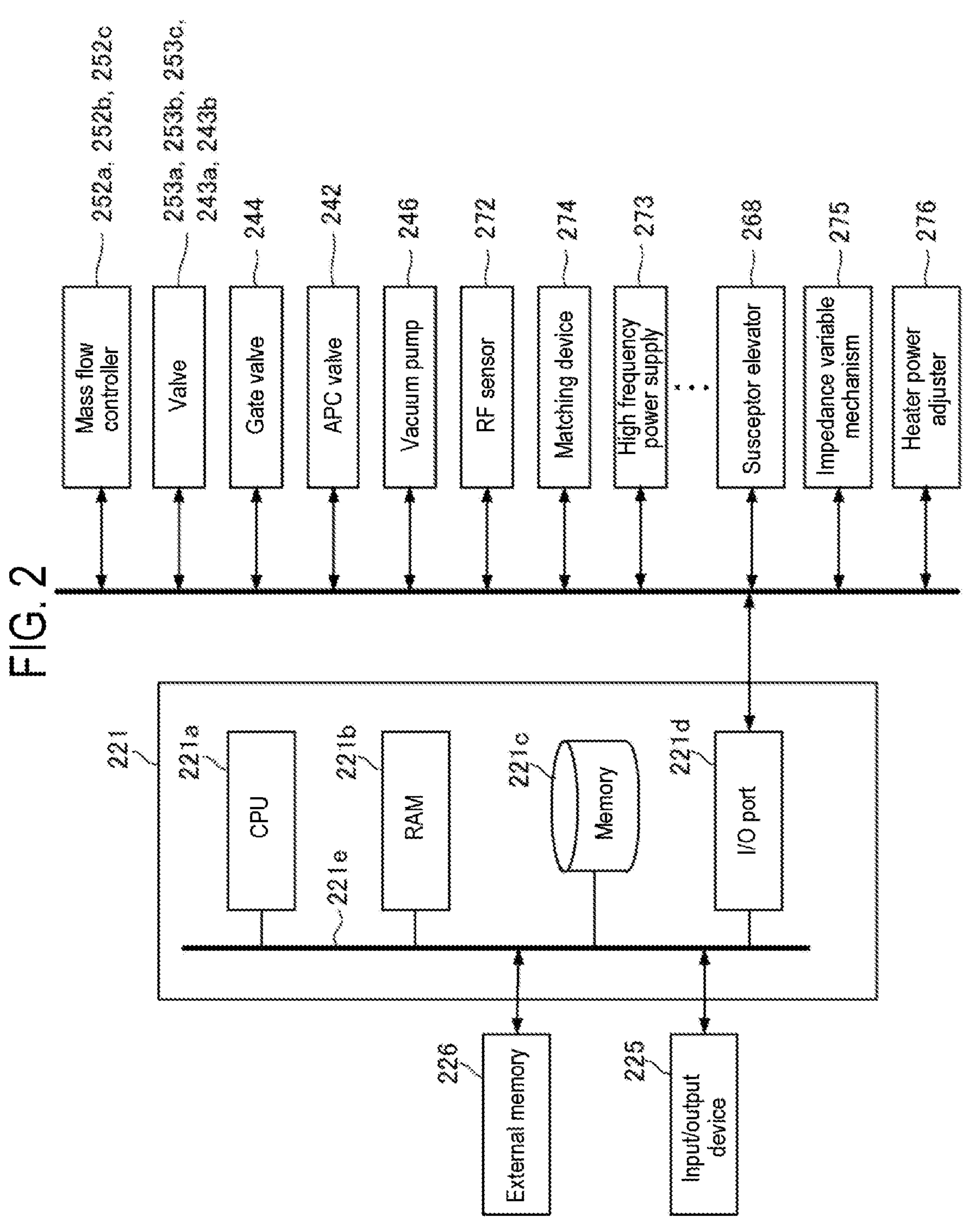
FIG. 2 is a diagram showing the configuration of a controller (control means) of the substrate processing apparatus suitably used in the embodiment of the present disclosure.

As shown in FIG. 2, the controller 221, which is the controller (control means), is configured as a computer including a central processing unit (CPU) 221*a*, a random access memory (RAM) 221*b*, a memory 221*c*, and an I/O port 221*d*. The RAM 221*b*, the memory 221*c*, and the I/O port 221*d* are configured to be capable of exchanging data with the CPU 221*a* via an internal bus 221*e*. An input/output device 225 configured as, for example, a touch panel or a display, is connected to the controller 221.

The memory 221*c* is configured by, for example, a flash memory, a hard disk drive (HDD), or the like. A control program for controlling operations of a substrate processing apparatus, a process recipe in which sequences and conditions of substrate processing, which will be described later, are written, etc. are readably stored in the memory 221*c*. The process recipe functions as a program for causing the controller 221 to execute each sequence in a substrate processing process, which will be described later, to obtain a predetermined result. Hereinafter, the process recipe and the control program may be generally and simply referred to as a "program." When the term "program" is used herein, it may indicate a case of including the process recipe only, a case of including the control program only, or a case of including both the process recipe and the control program. The RAM 221*b* is configured as a memory area (work area) in which a program or data read by the CPU 221*a* is temporarily stored.

The I/O port 221*d* is connected to the MFCs 252*a* to 252*c*, the valves 253*a* to 253*c*, 243*a*, and 243*b*, the gate valve 244, the APC valve 242, the vacuum pump 246, the RF sensor 272, the high frequency power supply 273, the matching device 274, the susceptor elevator 268, the impedance variable mechanism 275, the heater power adjuster 276, and the like.

The CPU 221*a* is configured to read and execute the control program from the memory 221*c*. The CPU 221*a* is also configured to read the process recipe from the memory 221*c* according to an input of an operation command from the input/output device 225. Then, the CPU 221*a* is configured to control the operation of adjusting the opening degree of the APC valve 242, the opening/closing operation of the valve 243*b*, and the actuating and stopping of the vacuum pump 246 through the I/O port 221*d* and the signal line A, the elevating operation of the susceptor elevator 268 through the signal line B, the operation of adjusting the amount of power supplied to the heater 217*b* (the temperature adjusting operation) by the heater power adjuster 276 and the operation of adjusting the impedance by the impedance variable mechanism 275 through the signal line C, the opening/closing operation of the gate valve 244 through the signal line D, the operations of the RF sensor 272, the matching device 274, and the high frequency power supply 273 through the signal line E, the operation of adjusting the flow rates of various kinds of gases by the MFCs 252*a* to 252*c* and the opening/closing operation of the valves 253*a* to 253*c* and 243*a* through the signal line F, and the like, according to contents of the read process recipe.

The controller 221 may be configured by installing, on the computer, the aforementioned program stored in an external memory (for example, a magnetic tape, a magnetic disk such as a flexible disk or a hard disk, an optical disc such as a CD or a DVD, a magneto-optical disc such as a MO, a semiconductor memory such as a USB memory or a memory card, and the like) 226. The memory 221*c* and the external memory 226 are configured as a non-transitory computer-readable recording medium. Hereinafter, the memory 221*c* and the external memory 226 may be generally and simply referred to as a "recording medium." When the term "recording medium" is used herein, it may indicate a case of including the memory 221*c* only, a case of including the external memory 226 only, or a case of including both the memory 221*c* and the external memory 226. The program may be provided to the computer using a communication means such as the Internet or a dedicated line, instead of using the external memory 226.

(2) SUBSTRATE PROCESSING PROCESS

Figure 3:
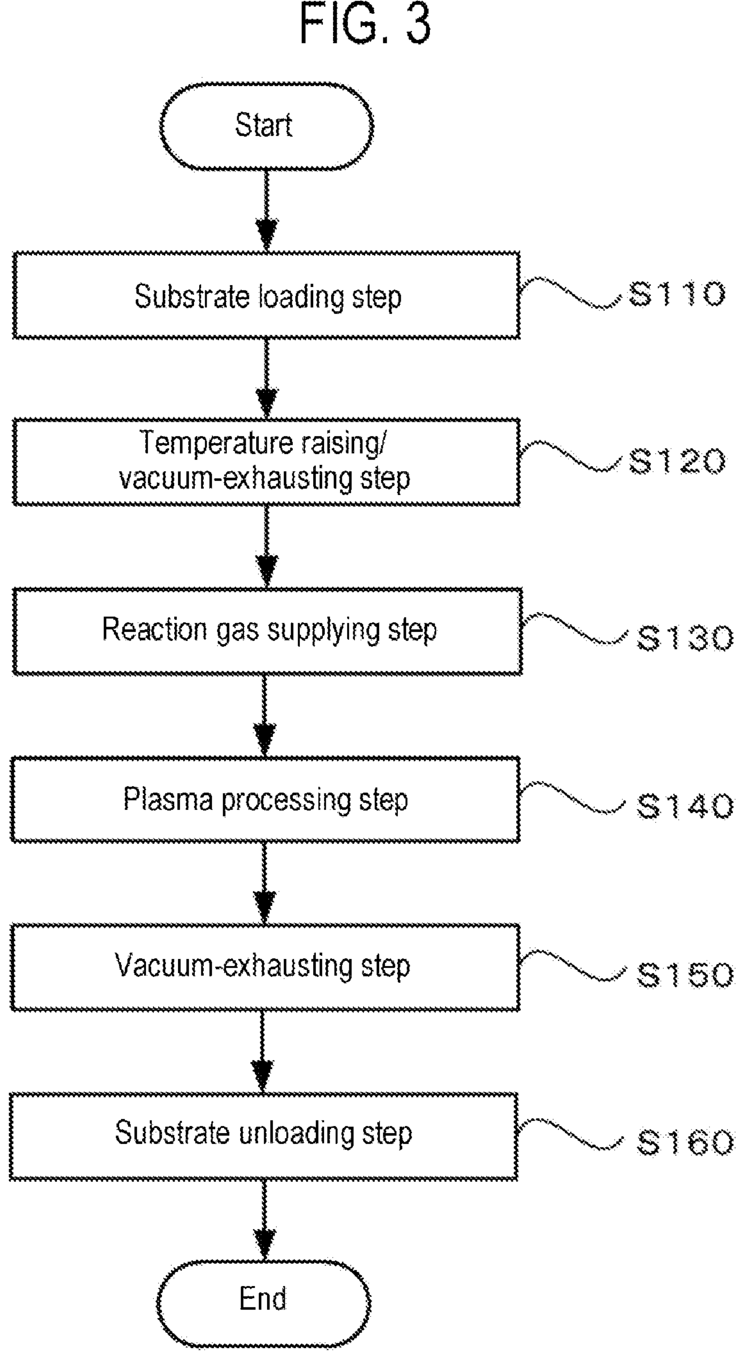
FIG. 3 is a flow chart showing a substrate processing process suitably used in the embodiment of the present disclosure.

Next, a substrate processing process according to one embodiment of the present disclosure will be described mainly with reference to FIG. 3. FIG. 3 is a flow chart showing a substrate processing process according to one embodiment of the present disclosure. The substrate processing process according to one embodiment of the present disclosure, which is one of processes of manufacturing a semiconductor device such as a flash memory, is carried out by the above-described substrate processing apparatus 100. In the following description, the operations of various parts constituting the substrate processing apparatus 100 are controlled by the controller 221. In the following, an example will be described in which a silicon (Si) layer on the surface of a wafer 200 is subjected to an oxidation process as a process using plasma.

(Substrate Loading Step S110)

First, the wafer 200 is loaded into the process chamber 201. Specifically, the susceptor elevator 268 lowers the susceptor 217 to a transfer position of the wafer 200 to penetrate the wafer push-up pins 266 through the through-holes 217*a* of the susceptor 217.

Subsequently, the gate valve 244 is opened, and the wafer 200 is loaded into the process chamber 201 from a vacuum transfer chamber adjacent to the process chamber 201 by using a wafer transfer mechanism (not shown). The loaded wafer 200 is supported in a horizontal posture on the wafer push-up pins 266 protruded from the surface of the susceptor 217. After that, the wafer transfer mechanism (wafer transfer) is retracted to the outside of the process chamber 201, and the gate valve 244 is closed to seal the interior of the process chamber 201. Then, the susceptor elevator 268 raises the susceptor 217 so that the wafer 200 is supported on the upper surface of the susceptor 217.

(Temperature Raising/Vacuum-Exhausting Step S120)

Subsequently, the temperature of the wafer 200 loaded into the process chamber 201 is raised. Further, while the temperature of the wafer 200 is raised, the interior of the process chamber 201 is vacuum-exhausted by the vacuum pump 246 via the gas exhaust pipe 231 to set the internal pressure of the process chamber 201 to a predetermined value.

(Reaction Gas Supplying Step S130)

Next, the supply of an oxygen-containing gas and a hydrogen-containing gas, as a process gas, is started. Specifically, the valves 253*a* and 253*b* are opened, and the oxygen-containing gas and the hydrogen-containing gas are started to be supplied into the process chamber 201 while their flow rates are controlled by the MFCs 252*a* and 252*b*, respectively.

Further, the opening degree of the APC valve 242 is adjusted to control the exhaust of the interior of the process chamber 201 so that the internal pressure of the process chamber 201 becomes a predetermined pressure in a range of, for example, 1 to 250 Pa. In this manner, while appropriately exhausting the interior of the process chamber 201, the supply of the oxygen-containing gas and the hydrogen-containing gas is continued until a plasma processing step S140 to be described later is completed. The notation of a numerical range such as "1 to 250 Pa" in the present disclosure means that a lower limit and an upper limit are included in the range. Therefore, for example, "1 to 250 Pa" means "1 Pa or more and 250 Pa or less." The same applies to other numerical ranges.

Examples of the oxygen-containing gas may include oxygen ($O_2$) gas, nitrous oxide ($N_2O$) gas, nitric oxide (NO) gas, nitrogen dioxide ($NO_2$) gas, ozone ($O_3$) gas, water vapor ($H_2O$ gas), carbon monoxide (CO) gas, carbon dioxide ($CO_2$) gas, and the like. One or more of these gases can be used as the oxygen-containing gas.

Further, examples of the hydrogen-containing gas may include a hydrogen ($H_2$) gas, deuterium ($D_2$) gas, $H_2O$ gas, ammonia ($NH_3$) gas, and the like. One or more of these gases can be used as the hydrogen-containing gas. When $H_2O$ gas is used as the oxygen-containing gas, it is preferable to use a gas other than the $H_2O$ gas, as the hydrogen-containing gas, and when $H_2O$ gas is used as the hydrogen-containing gas, it is preferable to use a gas other than the $H_2O$ gas, as the oxygen-containing gas.

Examples of the nitrogen-containing gas may include a nitrogen ($N_2$) gas, mixture of $N_2$ gas and $H_2$ gas, ammonia ($NH_3$) gas, $NH_2$ gas, and the like. One or more of these gases can be used as the nitrogen-containing gas.

(Plasma Processing Step S140)

When the internal pressure of the process chamber 201 is stabilized, the application of the high frequency power to the resonance coil 212 from the high frequency power supply 273 via the RF sensor 272 is started.

As a result, a high frequency electric field is formed in the plasma generation space into which the oxygen-containing gas and the hydrogen-containing gas are supplied, and donut-shaped ICP having a highest plasma density is excited at a height position corresponding to the electrical midpoint of the resonance coil 212 and height positions near the upper and lower ends of the resonance coil 212 in the plasma generation space by this electric field. The oxygen-containing gas and the hydrogen-containing gas in the plasma state are dissociated to generate reactive species such as oxygen-active species (oxidizing species) containing oxygen and hydrogen-active species (hydrogen species) containing hydrogen.

The reactive species such as oxidizing species and hydrogen species generated by plasma excitation are uniformly supplied onto the wafer 200. The reactive species supplied to the wafer 200 react within the process container 203 to modify a layer (for example, a Si layer) of the surface of the wafer 200 into an oxide layer (for example, a Si oxide layer).

After that, with the lapse of a predetermined processing time, the output of the power from the high frequency power supply 273 is stopped and the plasma discharge in the process chamber 201 is stopped. Further, the valves 253*a* and 253*b* are closed and the supply of the oxygen-containing gas and the hydrogen-containing gas into the process chamber 201 is stopped. Then, the plasma processing step S140 is completed.

(Vacuum-Exhausting Step S150)

When the supply of the oxygen-containing gas and the hydrogen-containing gas is stopped, the interior of the process chamber 201 is vacuum-exhausted through the gas exhaust pipe 231.

(Substrate Unloading Step S160)

When the interior of the process chamber 201 reaches a predetermined pressure, the susceptor 217 is lowered to the transfer position of the wafer 200, and the wafer 200 is supported on the wafer push-up pins 266. Then, the gate valve 244 is opened, and the wafer 200 is unloaded to the outside of the process chamber 201 by using the wafer transfer mechanism.

With the above, the substrate processing process according to the one embodiment of the present disclosure is completed.

Here, in the above-described plasma processing step (S140), when the electrical length of the resonance coil 212 corresponds to one wavelength of the high frequency power supplied from the high frequency power supply 273, standing waves of current and voltage having a length of one wavelength of the supplied high frequency power are formed on the line of the resonance coil 212. Among waveforms on the right side of FIG. 4, a dashed line indicates a current and a solid line indicates a voltage. As shown by the waveforms on the right side of FIG. 4, the amplitude of the current standing wave is maximum at both ends (lower and upper ends) and midpoint of the resonance coil 212, and is minimum at positions in between. The amplitude of the voltage standing wave is minimum at both ends (lower end and upper end) and midpoint of the resonance coil 212, and is maximum at positions in between.

A high frequency magnetic field is formed in the vicinity of the positions where the amplitude of the current is maximized, and a high frequency electric field induced by this high frequency magnetic field causes discharge of the process gas supplied into the process chamber 201. Plasma of the process gas is generated by exciting the process gas with this discharge. Hereinafter, the plasma of the process gas generated by the high frequency magnetic field formed in the vicinity of the positions (regions) where the current amplitude is large is referred to as plasma of an ICP (Inductively Coupled Plasma) component. As shown on the left side of FIG. 4, the plasma of the ICP component is intensively generated in a donut shape in a region near both ends and the midpoint of the resonance coil 212 (which is referred to as an ICP region) in a space along an inner wall surface 203*b* of the process container 203. Then, by performing the substrate processing process a plurality of times, as shown in FIG. 5, sublimates of the wafer 200 are convexly deposited on the inner wall surface of the process container 203 in the regions near both ends and center of the resonance coil 212, in which the plasma of the ICP component is formed, and a film 300 as a deposited film is formed. Here, the film 300 is, for example, a Si (silicon)-containing film which is the main component of the wafer 200. When the substrate processing in the substrate processing process is an oxidation process, the film 300 is a Si oxide film, and when the substrate processing in the substrate processing process is a nitridation process, the film 300 is a Si nitride film.

Figure 4:
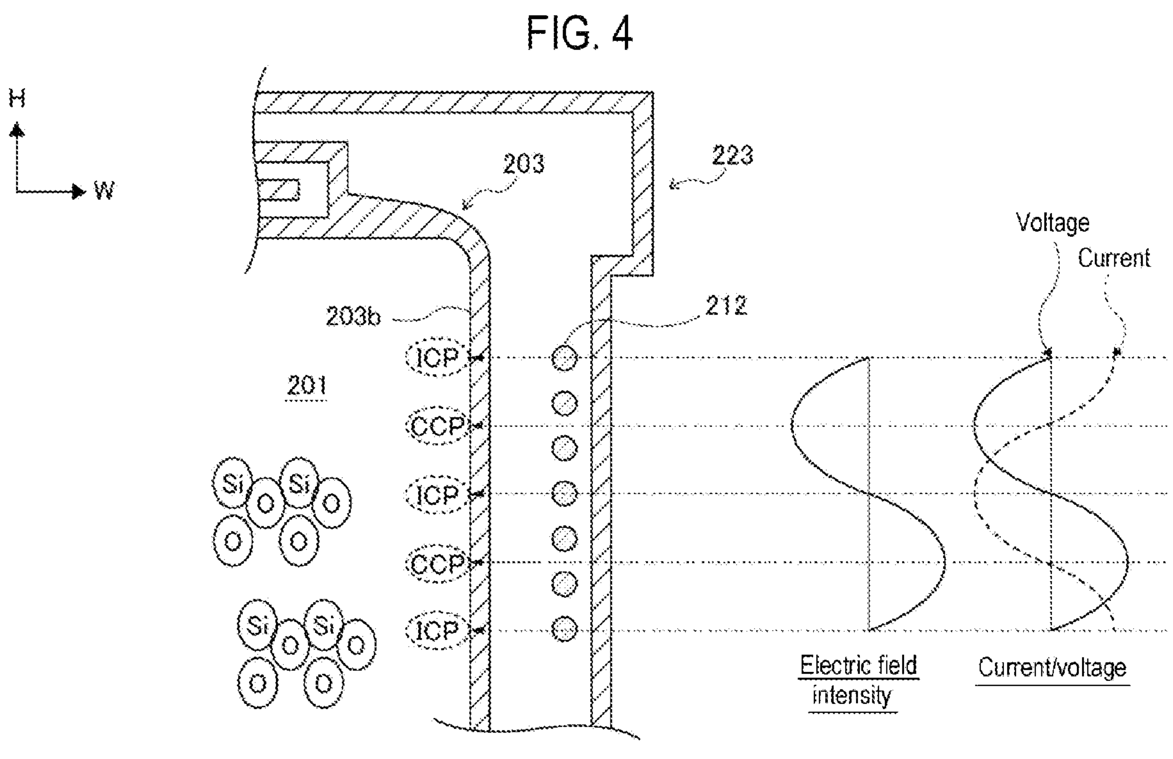
FIG. 4 is an explanatory view showing the relationship between a resonance coil, an electric field intensity, and a current/voltage, and the like, which are suitably used in the embodiment of the present disclosure.
Figure 5:
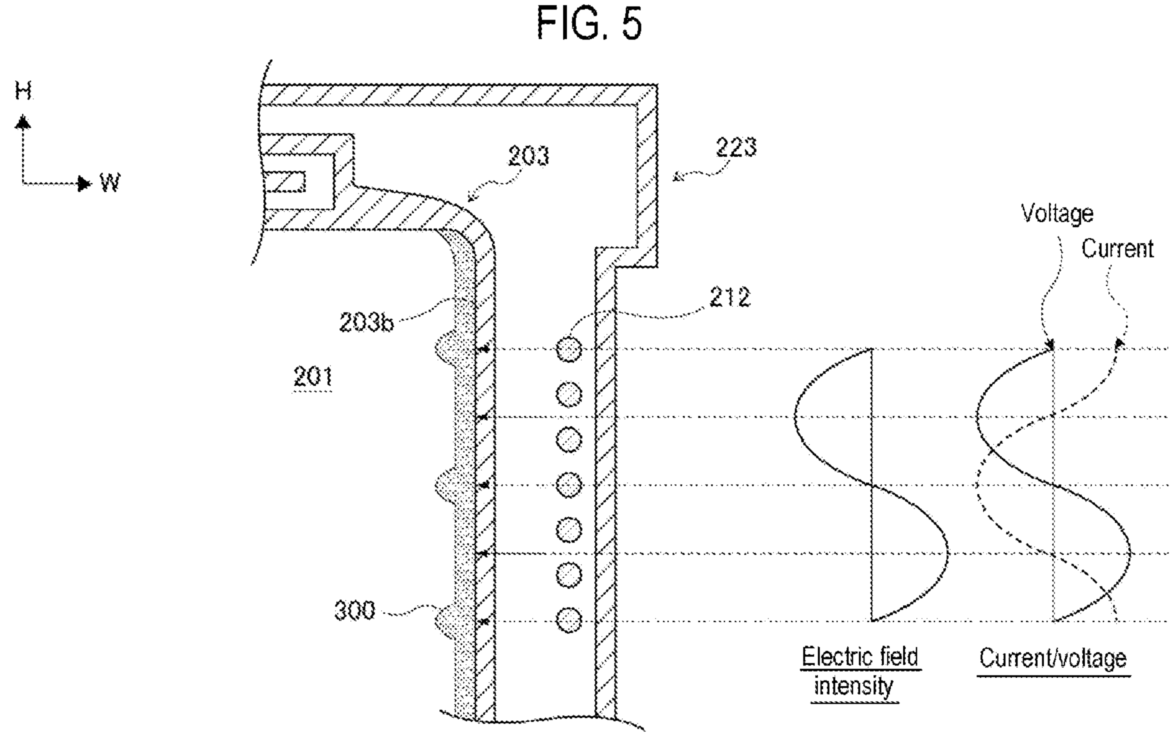
FIG. 5 is a view for explaining a state of an inner wall surface of the substrate processing apparatus after the substrate processing process suitably used in the embodiment of the present disclosure.
Figure 6:
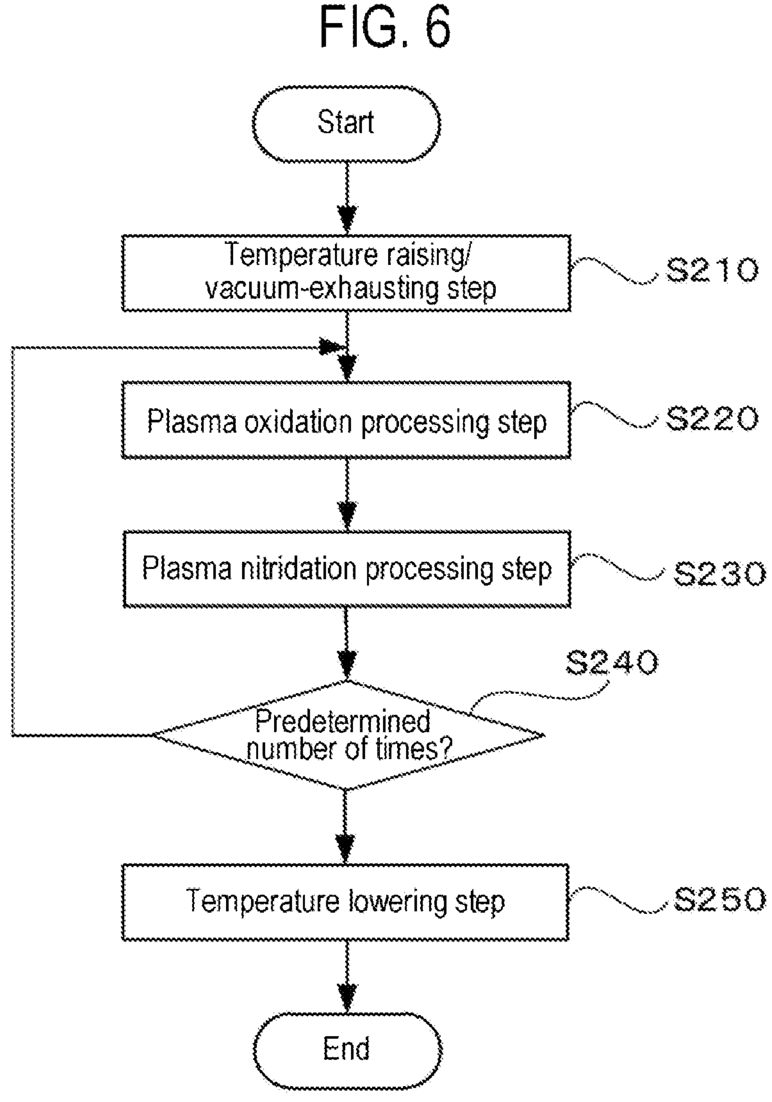
FIG. 6 is a flow chart showing a cleaning process suitably used in the embodiment of the present disclosure.

In contrast, as shown in the waveforms on the right side of FIG. 4, the amplitude of the voltage standing wave is minimum at both ends (lower and upper ends) and midpoint of the resonance coil 212, and is maximum at positions in between.

The waveform on the left side of FIG. 4 indicates the intensity of the high frequency electric field formed according to the amplitude of the voltage of the resonance coil 212. The high frequency electric field having a particularly high electric field strength is formed near the positions where the amplitude of the voltage is maximum, and this high frequency electric field causes the discharge of the process gas supplied into the process chamber 201. The plasma of the process gas is generated by exciting the process gas with this discharge.

Hereinafter, the plasma of the process gas generated by the high frequency electric field formed in the vicinity of the positions (regions) where the voltage amplitude is large is referred to as plasma of a CCP (Capacitively Coupled Plasma) component. As shown on the left side of FIG. 4, the plasma of the CCP component is intensively generated in a donut shape in a region between the upper end and the midpoint of the resonance coil 212 and a region between the lower end and the midpoint of in the resonance coil 212 (which are collectively referred to as a CCP region) in the space along an inner wall surface 203*b* of the process container 203.

Here, reactive species such as oxidizing species and nitriding species and electrons (electric charges) are generated from the plasma of the CCP component. The electrons generated at this time are attracted to the inner wall surface 203*b* of the process container 203 by an electric field that generates the plasma of the CCP component, so that the inner wall surface 203*b* of the process container 203 is charged with the electrons (electric charges). Then, the reactive species generated by excitation of the plasma of the CCP component are accelerated toward and collide with the inner wall surface 203*b* charged with the electrons (electric charges). As a result, the film 300 formed on the inner wall surface 203*b* of the process container 203 and/or the surface of the inner wall surface 203*b* is sputtered and etched, and the components of the material forming the process container 203 are released and diffused into the process chamber 201. In the case of the present embodiment, the film 300 formed on the inner wall surface 203*b* is sputtered and etched, so that components such as silicon (Si) or oxygen (O) that constitute quartz are released and diffused into the process chamber 201. As a result, the film 300 contains not only of the sublimates of the wafer 200 but also silicon (Si) or oxygen (O) which constitute quartz are released and diffused into the process chamber 201 when the inner wall surface 203*b* of the process container 203 is etched by sputtering or the like. That is, the convex film 300 produced in the ICP region is a nitride film or oxide film formed by a nitridation process or oxidation process, and the film contains the components released by being sputtered and etched in the CCP region.

The released/diffused components such as Si or O may be introduced, as impurities, into a film such as an oxide film formed on the wafer 200 by plasma processing, which may degrade the properties of the film. Further, when the inner wall surface 203*b* of the process container 203 is sputtered and etched, particles may be generated in the process chamber 201. These particles may adhere to the surface of the film on the wafer 200, which may have an effect of lowering a performance of device or a yield of device.

In the present disclosure, after the substrate processing process as described above, a cleaning process, which will be described below, is performed to facilitate removal of the deposited film deposited on the process container 203.

(3) CLEANING PROCESS

A process (cleaning process) of modifying the film 300 formed and deposited in the process container 203 in the substrate processing process will be described with reference to FIGS. 6 and 7A to 7C. As a process of manufacturing a semiconductor device, the cleaning process according to one embodiment of the present disclosure is performed by the substrate processing apparatus 100 in the same manner as the above-described substrate processing process.

Figure 7A:
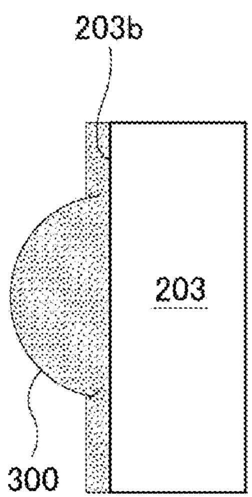
FIG. 7A is a view showing the state of the inner wall surface of the substrate processing apparatus after the substrate processing process.

This process is performed in a state where the wafer 200 is not accommodated in the process chamber 201. As a result, it is possible to prevent substances derived from the wafer 200 newly adhering to the inner wall surface 203*b* and the like inside the process container 203 in this process. The film 300 is formed as the deposited film on the inner wall surface 203*b* of the process container 203, as shown in FIG. 7A. Here, the film 300 is a Si (silicon)-containing film that is the sublimates of the wafer 200 and a SiO (silicon oxide) film that is an oxide film.

(Temperature Raising/Vacuum-Exhausting Step S210)

First, in a state where the wafer 200 is not accommodated in the process chamber 201, the gate valve 244 is closed to seal the interior of the process chamber 201 and the internal temperature of the process chamber 201 is raised. For example, the temperature of the inner wall surface 203*b* of the process container 203 is raised to around 200 degrees C. Further, while the internal temperature of the process chamber 201 is being raised, the interior of the process chamber 201 is vacuum-exhausted by the vacuum pump 246 through the gas exhaust pipe 231, so that the internal pressure of the process chamber 201 is set to a predetermined value. The vacuum pump 246 is left running until the cleaning process is completed. At this time, the temperature of the inner wall surface 203*b* of the process container 203 may be set to be higher than the temperature of the inner wall surface 203*b* of the process container 203 in the plasma processing step (S140) of the above-described substrate processing process. By increasing the temperature in this step to increase a difference from the temperature in a temperature lowering step which will be described later, a stress caused by the temperature lowering can be increased, so that the peeling of the film 300 can be promoted.

(Plasma Oxidation Processing Step S220)

[Oxygen-Containing Gas Supply]

Next, the supply of oxygen-containing gas is started. Specifically, the valve 253*a* is opened to start supplying the oxygen-containing gas into the process chamber 201 while controlling its flow rate by the MFC 252*a*. At this time, the flow rate of the oxygen-containing gas is set to a predetermined value within a range of, for example, 200 to 2,000 sccm.

Further, the exhaust of the interior of the process chamber 201 is controlled by adjusting the opening degree of the APC valve 242 so that the internal pressure of the process chamber 201 becomes a predetermined pressure within a range of, for example, 50 to 200 Pa, specifically 50 to 100 Pa.

Examples of the oxygen-containing gas may include $O_2$ gas, $N_2O$ gas, NO gas, $NO_2$ gas, $O_3$ gas, $H_2O$ gas, CO gas, $CO_2$ gas, hydrogen peroxide ($H_2O_2$) gas, a mixture of $O_2$ gas and $H_2$ gas, and the like. One or more of these gases can be used as the oxygen-containing gas.

When the mixture of $O_2$ gas and $H_2$ gas is used as the oxygen-containing gas, an oxidation rate in each cycle can be controlled by adjusting the ratio of hydrogen in the mixed gas. For example, the oxidation rate can be adjusted to decrease by increasing the ratio of hydrogen contained in the mixed gas in a range of 5% or more, excluding a range where the oxidation rate increases.

[Plasma Processing]

When the internal pressure of the process chamber 201 is stabilized, the application of high frequency power, which is predetermined power in a range of, for example, 500 to 3,500 W, to the resonance coil 212 from the high frequency power supply 273 via the RF sensor 272 is started. The oxygen-containing gas supplied into the process chamber 201 is plasma-excited to oxidize the film 300. The power of an electromagnetic field, which is applied to plasma-excite the oxygen-containing gas at this time, may be set to be smaller than the power of the electromagnetic field applied to plasma-excite the oxygen-containing gas in the plasma processing step (S140) of the above-described substrate processing process. That is, plasma oxidation electric power in the substrate processing process may be set to be higher than plasma oxidation electric power in the cleaning process. As a result, the oxidizing power to the film 300 is suppressed, which facilitates formation of a film including a nitride layer and an oxide layer without completely oxidizing a nitride layer formed on the surface of the film 300 in the second and subsequent cycles.

Further, the internal pressure of the process chamber 201 in this step may be set to be higher than the internal pressure of the process chamber 201 in the plasma processing step (S140). That is, the plasma oxidation processing pressure in the substrate processing process may be set to be lower than the plasma oxidation processing pressure in the cleaning process. Even under this condition, the oxidizing power to the film 300 is suppressed, which facilitates formation of a stack of oxide layer and nitride layer without completely oxidizing a nitride layer formed on the surface of the film 300 in the second and subsequent cycles. In this application, the processing pressure means the internal pressure of the process chamber 201. The same applies to the following description.

Further, the execution time in this step may be set to be shorter than the execution time in the plasma processing step (S140). That is, the plasma oxidation processing time in the substrate processing process may be set to be longer than the plasma oxidation processing time in the cleaning process. Even under this condition, the oxidizing power to the film 300 is suppressed, which facilitates formation of a stack of oxide layer and nitride layer without completely oxidizing a nitride layer formed on the surface of the film 300 in the second and subsequent cycles. The execution time in this step may be set to, for example, 2 minutes or less.

As a result, a high frequency electromagnetic field is formed in the plasma generation space to which the oxygen-containing gas is supplied, and a donut-shaped ICP having the highest plasma density is excited by this electromagnetic field at the height position corresponding to the electrical midpoint of the resonance coil 212 and the height positions near the upper and lower ends of the resonance coil 212 in the plasma generation space. The oxygen-containing gas in the plasma state is dissociated to generate reactive species such as oxygen-containing oxidizing species. That is, a donut-shaped ICP is formed at the height position corresponding to the electrical midpoint of the resonance coil 212 and the height positions near the upper and lower ends of the resonance coil 212, both of which are substantially equal to positions in the process chamber 201 where the plasma of the oxygen-containing gas is excited in the above-described plasma processing step (S140). In this manner, in the cleaning process, by generating the plasma at the same positions as the ICP region locally formed on the inner wall surface 203*b* in the process container 203 in the substrate processing process, the oxidation process can be intensively performed on the convex portions of the film 300 that are formed locally in a convex shape, so that a film stress can be generated in the convex portions to facilitate the peeling from the inner wall surface 203*b* and the like.

The oxidizing species supplied into the process chamber 201 reacts with the film 300 to modify the layer of the surface of the film 300 into an oxide layer. For example, the surface of the Si-containing film formed on the inner wall surface 203*b* and the like is oxidized to be modified into a Si-containing oxide layer.

(Plasma Nitridation Processing Step S230)

[Nitrogen-Containing Gas Supply]

Next, the supply of nitrogen-containing gas is started. Specifically, the valve 253*c* is opened to start supplying the nitrogen-containing gas into the process chamber 201 while controlling its flow rate by the MFC 252*c*. At this time, the flow rate of the nitrogen-containing gas is set to a predetermined value within a range of, for example, 100 to 1,000 sccm.

Further, the exhaust of the interior of the process chamber 201 is controlled by adjusting the opening degree of the APC valve 242 so that the internal pressure of the process chamber 201 becomes a predetermined pressure within a range of, for example, 5 to 20 Pa, specifically 5 Pa, which is lower than the pressure in the above-described plasma oxidation processing step (S220). That is, the internal pressure of the process chamber 201 in this step is set to be lower than the internal pressure of the process chamber 201 in the above-described plasma oxidation processing step (S220). That is, in the cleaning process, plasma oxidation processing pressure is set to be higher than the plasma nitridation processing pressure. Due to this pressure difference, it is possible to weaken the oxidation condition for the plasma oxidation process and strengthen the plasma nitridation processing condition. This can prevent the nitride layer formed by the plasma nitridation process from being completely oxidized by the plasma oxidation process. Therefore, it becomes easy to form a stack of oxide layer and nitride layer.

Examples of the nitrogen-containing gas may include nitrogen ($N_2$) gas, a mixture of $N_2$ gas and $H_2$ gas, ammonia ($NH_3$) gas, $NH_2$ gas, and the like. One or more of these gases can be used as the nitrogen-containing gas.

When the mixture of $N_2$ gas and $H_2$ gas is used as the nitrogen-containing gas, an oxidation rate in each cycle can be controlled by adjusting the ratio of hydrogen in the mixed gas.

[Plasma Processing]

When the internal pressure of the process chamber 201 is stabilized, the application of high frequency power, which is predetermined power in a range of, for example, 500 to 2,000 W, to the resonance coil 212 from the high frequency power supply 273 via the RF sensor 272 is started. The nitrogen-containing gas supplied into the process chamber 201 is plasma-excited to nitride the film 300. At this time, the power of an electromagnetic field, which is applied to plasma-excite the nitrogen-containing gas in this step is set to be greater than or equal to the power of the electromagnetic field applied to plasma-excite the oxygen-containing gas in the above-described plasma oxidation processing step (S220). That is, in the cleaning process, plasma oxidation electric power is set to be higher than plasma nitridation electric power. With this electric power condition, it is possible to weaken the oxidation condition for the plasma oxidation process and strengthen the plasma nitridation processing condition. This method can also prevent the nitride layer formed by the plasma nitridation process from being completely oxidized by the plasma oxidation process. Therefore, it becomes easy to form a stack of oxide layer and nitride layer.

The execution time of this step is, for example, about 2 minutes, which may be longer than the execution time of the above-described plasma oxidation processing step (S220). That is, in the cleaning process, the plasma oxidation processing time is set to be equal to or shorter than the plasma nitridation processing time. With this time condition, it is possible to weaken the oxidation condition by the plasma oxidation process and strengthen the plasma nitridation processing condition. This method can also prevent the nitride layer formed by plasma nitridation process from being completely oxidized by the plasma oxidation process. Therefore, it becomes easy to form a stack of oxide layer and nitride layer.

At this time, similarly to the plasma oxidation processing step S220 using the oxygen-containing gas in the cleaning process, in the cleaning process, the nitrogen-containing gas is dissociated at the same position as the ICP region locally formed on the inner wall surface 203*b* and the like in the process container 203 by the substrate processing process, thereby generating plasma containing reactive species such as nitrogen species containing nitrogen, the nitridation process can be intensively performed on the convex portions of the film 300 that are formed locally in a convex shape.

The nitriding species supplied into the process chamber 201 reacts with the film 300 to modify the layer (for example, a Si-containing oxide layer) of the surface of the film 300 into a nitride layer (for example, a Si-containing nitride layer). For example, the surface of the Si-containing oxide film formed on the inner wall surface 203*b* and the like is nitrided to be modified into a Si-containing nitride layer.

(Performing Predetermined Number of Times S240)

Figure 7B:
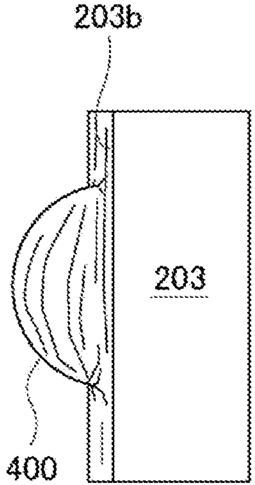
FIG. 7B is a view showing the state of the inner wall surface of the substrate processing apparatus after the cleaning process.

A cycle including the above-described plasma oxidation process S220 and plasma nitridation process S230 is performed a predetermined number of times, that is, a plurality of times. As a result, the film 300 formed on the inner wall surface 203*b* and the like inside the process container 203 in the substrate processing process is modified into a film 400 including an oxide layer and a nitride layer, as shown in FIG. 7B.

(Temperature Lowering Step S250)

Next, the internal temperature of the process chamber 201, which is the temperature of the inner wall surface 203*b* of the process container 203, is lowered from the temperature of the inner wall surface 203*b* of the process container 203 in the plasma oxidation processing step (S220) and the plasma nitridation processing step (S230) to, for example, the room temperature which is about 25 degrees C.

Here, the oxide layer and the nitride layer have different coefficients of thermal expansion at which their volumes expand with temperature rise. The oxide layer has a larger coefficient of thermal expansion than the nitride layer. Therefore, when the temperature is lowered from a high temperature environment to, for example, the room temperature, the oxide layer contracts more than the nitride layer. Therefore, by modifying the film 300 into the film 400 including the Si-containing oxide layer and the Si-containing nitride layer having different coefficients of thermal expansion, an interlayer (interface) stress due to the difference in the coefficient of thermal expansion can be generated inside the film 400 by a temperature lowering step (S250). As a result, the film 400 deposited inside the process container 203 can be brought into an unstable state with a large internal stress, and so can be brought into a state of being easily peeled off. Therefore, the deposited film can be removed efficiently. Further, as a temperature difference between the plasma oxidation processing step and the plasma nitridation processing step increases, a stress applied to the film 400 can be increased, so that the peeling of the film 400 can be promoted.

Figure 7C:
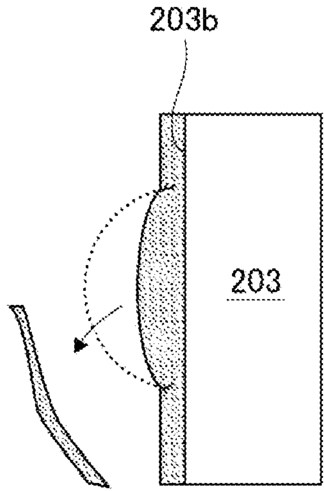
FIG. 7C is a view showing the state of the inner wall surface of the substrate processing apparatus during wiping.

Next, as shown in FIG. 7C, the film 400 including the oxide layer and the nitride layer is peeled off from the inner wall of the process container 203. Specifically, the inner wall surface 203*b* and the like of the process container 203 are wiped off to remove the film 400 from the inner wall surface 203*b*. This facilitates the removal of the film 400 including the oxide layer and the nitride layer formed on the inner wall surface 203*b* and the like of the process container 203, for example, the peel of the film 400 by wiping. The wiping may be performed periodically, such as once every few weeks or after performing the substrate processing a predetermined number of times, or may be performed at a timing when foreign matters such as particles come out.

In other words, due to the temperature lowering step S250, a stress is generated in the interlayer (interface) in the film 400, making it easy to peel off. Therefore, the film 400 can be easily removed (peeled off). By improving the removal efficiency in this way, the risk of metal contamination accompanying the removal can be reduced, and the apparatus operation rate can be improved.

Further, without being limited to the case of removing the film 400 from the inner wall surface 203*b* by wiping the inner wall surface 203*b* and the like, a method other than wiping, such as using a gas such as an etching gas or a cleaning gas that reacts with the film 400 to remove the film 400 from the inner wall surface 203*b*, may also be used. That is, by modifying the film 300 into the film 400 that can be easily peeled off, the film 400 can be easily removed (peeled off) from the inner wall surface 203*b*. Therefore, by improving the removal efficiency, it is possible to reduce the risk of metal contamination accompanying the removal and improve the apparatus operation rate.

(4) MODIFICATIONS

The cleaning process in the above-described embodiment can be modified as in the modifications shown below. Unless otherwise stated, a configuration in each modification is the same as the configuration in the above-described embodiment, and explanation thereof will not be repeated.

Modification 1

In Modification 1, in the above-described cleaning step, when the cleaning step is performed a predetermined number of times (S240), the power of the electromagnetic field applied to plasma-excite the oxygen-containing gas in the n-th plasma oxidation processing step (S220) as a first cycle is set to be higher than the power of the electromagnetic field applied to plasma-excite the oxygen-containing gas in the (n+1)-th plasma oxidation processing step (S220) as a second cycle executed after the first cycle. That is, the plasma oxidation electric power for the n-th layer is set to be higher than the plasma oxidation electric power for the (n+1)-th layer. At this time, the processing condition in the plasma nitridation processing step (S230) during the n-th cycle is set to be the same as the processing condition in the plasma nitridation processing step (S230) during the (n+1)-th cycle.

At this time, the internal pressure of the process chamber 201 in the plasma oxidation processing step (S220) during the n-th cycle may be set to be lower than the internal pressure of the process chamber 201 in the plasma oxidation processing step (S220) during the (n+1)-th cycle. That is, the oxidation processing pressure for the n-th layer may be set to be lower than the oxidation processing pressure for the (n+1)-th layer.

Further, at this time, the execution time of the plasma oxidation processing step (S220) during the n-th cycle may be set to be longer than the execution time of the plasma oxidation processing step (S220) during the (n+1)-th cycle. That is, the oxidation processing time for the n-th layer may be set to be longer than the oxidation processing time for the (n+1)-th layer.

From the above, the oxidizing power for forming the (n+1)-th oxide layer can be suppressed (weakened) more than the oxidizing power for forming the n-th oxide layer. Therefore, the film 400 including the oxide layer and the nitride layer can be easily formed without completely oxidizing the nitride layer formed in the plasma nitridation processing step (S230), and the film 400 can be easily removed (peeled off) from the inner wall surface 203*b*.

Further, when a mixture of $O_2$ gas and $H_2$ gas is used as the oxygen-containing gas, a ratio of hydrogen contained in the oxygen-containing gas supplied into the process chamber 201 in the plasma oxidation processing step (S220) during the n-th cycle may be set to be different from the ratio of hydrogen contained in the oxygen-containing gas supplied into the process chamber 201 in the plasma oxidation processing step (S220) during the (n+1)-th cycle. This makes it possible to adjust the oxidizing power.

OTHER EMBODIMENTS

Various typical embodiments and modifications of the present disclosure have been described above, but the present disclosure is not limited to those embodiments and modifications, and can be used in combination as appropriate.

For example, in the above-described embodiments, the substrate processing process has been described using the case where the oxide film formed on the inner wall surface 203*b* and the like is modified to be removed from the inner wall surface 203*b* after the plasma oxidation process is performed, but the present disclosure is not limited thereto. For example, the technique of the present disclosure can also be applied to a case where the nitride film formed on the inner wall surface 203*b* and the like is modified to be removed from the inner wall surface 203*b* after the plasma nitridation process is performed in the substrate processing process.

In this case, during the cleaning process, the power of the electromagnetic field applied to plasma-excite the nitrogen-containing gas in the plasma nitridation processing step (S230) is set to be higher than the power of the electromagnetic field applied to plasma-excite the nitrogen-containing gas in the substrate processing process, so that the nitriding power for the deposited film is strengthened. That is, the plasma nitriding electric power in the substrate processing process is set to be lower than the plasma nitriding electric power in the cleaning process. This makes it easier to form a stack of oxide layer and nitride layer.

Further, the internal pressure of the process chamber 201 in the plasma nitridation processing step (S230) may be set to be lower than the internal pressure of the process chamber 201 during the plasma nitridation process in the substrate processing process so as to strengthen the nitriding force for the deposited film. That is, the plasma nitridation processing pressure during the substrate processing process may be set to be higher than the plasma nitridation processing pressure during the cleaning process.

Further, the execution time of the plasma nitridation processing step (S230) may be set to be longer than the execution time of the plasma nitridation process in the substrate processing process so that the nitriding power for the deposited film is strengthened. That is, the plasma nitridation processing time during the substrate processing process may be set to be shorter than the plasma nitridation processing time during the cleaning process.

Further, in the above-described embodiments, the case where the deposited film formed in the process container 203 before the cleaning process is a Si-containing film has been described, but the present disclosure is not limited thereto. For example, the technique of the present disclosure can be applied to types of films which are composed of an element sublimated from the surface of the wafer 200 by substrate processing (plasma processing) on the wafer 200 and have different coefficients of thermal expansion between the oxide layer and the nitride layer. Specifically, the deposited film may be a film containing a metal element such as aluminum (Al), titanium (Ti), hafnium (Hf), tungsten (W), molybdenum (Mo), copper (Cu), sodium (Na), or potassium (K) or an element such as carbon (C), boron (B), phosphorus (P), or arsenic (As), all of which are sublimated from the surface of the wafer 200.

Further, in the above-described embodiments, the case where the cleaning process is performed in a state where the wafer 200 is not accommodated in the process container 203 has been described, but the present disclosure is not limited thereto. The cleaning process may be performed in a state where the wafer 200 is accommodated in the process container 203.

Although the present disclosure has been described in detail with respect to the specific embodiments and modifications, the present disclosure is not limited to such embodiments and modifications, and it is obvious to those skilled in the art that it is possible to take various other embodiments within the scope of the present disclosure.

According to the present disclosure in some embodiments, it is possible to easily remove the deposited film formed on the inner surface of the reaction container by plasma processing on the substrate.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A cleaning method comprising:

modifying a deposited film, which is formed on an inner surface of a reaction container, into a film including an oxide layer and a nitride layer by performing a cycle a predetermined number of times, the cycle including:

(a) oxidizing the deposited film by supplying an oxygen-containing gas into the reaction container and plasma-exciting the oxygen-containing gas; and (b) nitriding the deposited film by supplying a nitrogen-containing gas into the reaction container and plasma-exciting the nitrogen-containing gas;

(c) after modifying the deposited film, generating an interlayer stress between the oxide layer and the nitride layer in the film by lowering a temperature in the reaction container from a temperature of the reaction container in (a) and (b) to a room temperature; and (d) after (c), cleaning the inner surface of the reaction container by peeling off the film where the interlayer stress has been generated in (c) from the inner surface of the reaction container at a room temperature.

2. The cleaning method of claim 1, wherein the deposited film is a Si-containing film, the oxide layer is a Si-containing oxide layer, and the nitride layer is a Si-containing nitride layer.

3. The cleaning method of claim 1, wherein the deposited film is an oxide film.

4. The cleaning method of claim 1, wherein power of an electromagnetic field applied to plasma-excite the oxygen-containing gas in (a) is lower than power of an electromagnetic field applied to plasma-excite the nitrogen-containing gas in (b).

5. The cleaning method of claim 1, wherein a pressure in the reaction container in (a) is higher than a pressure in the reaction container in (b).

6. The cleaning method of claim 1, wherein an execution time of (a) per cycle is shorter than an execution time of (b) per cycle.

7. The cleaning method of claim 1, wherein the cycle is performed a plurality of times, and power of an electromagnetic field applied to plasma-excite the oxygen-containing gas in (a) during a first cycle is higher than power of an electromagnetic field applied to plasma-excite the oxygen-containing gas in (a) during a second cycle performed after the first cycle.

8. The cleaning method of claim 1, wherein the cycle is performed a plurality of times, and a pressure in the reaction container in (a) during a first cycle is lower than a pressure in the reaction container in (a) during a second cycle performed after the first cycle.

9. The cleaning method of claim 1, wherein the cycle is performed a plurality of times, and an execution time of (a) during a first cycle is longer than an execution time of (a) during a second cycle performed after the first cycle.

10. The cleaning method of claim 1, wherein (a) and (b) are performed in a state that a substrate is not accommodated in the reaction container.

11. The cleaning method of claim 1, further comprising performing, before performing the cycle including (a) and (b):

(e) oxidizing a surface of a substrate by supplying the oxygen-containing gas into the reaction container where the substrate is loaded and plasma-exciting the oxygen-containing gas; and (f) after (e), unloading the substrate from the reaction container.

12. A method of manufacturing a semiconductor device, comprising the cleaning method of claim 1, wherein the method of manufacturing the semiconductor device further comprises performing, before performing (a) and (b):

(e) modifying a surface of a substrate by supplying a process gas into the reaction container where the substrate is accommodated and plasma-exciting the process gas; and (f) after (e), unloading the substrate from the reaction container.

13. A non-transitory computer-readable recording medium storing a program that causes, by a computer, a substrate processing apparatus to perform the cleaning method of claim 1.

14. The cleaning method of claim 1, wherein the interlayer stress between the oxide layer and the nitride layer is generated in (c) due to a difference in a coefficient of thermal expansion between the oxide layer and the nitride layer.

15. The cleaning method of claim 1, wherein the film including the oxide layer and the nitride layer comprises a stack of the oxide layer and the nitride layer.

16. The cleaning method of claim 11, wherein power of an electromagnetic field applied to plasma-excite the oxygen-containing gas in (a) is lower than power of an electromagnetic field applied to plasma-excite the oxygen-containing bas in (e).

17. The cleaning method of claim 11, wherein a pressure in the reaction container in (a) is higher than a pressure in the reaction container in (e).

18. The cleaning method of claim 11, wherein an execution time of (a) is shorter than an execution time of (e).

* * * * *